United States Patent
Koike

(10) Patent No.: US 6,608,691 B1
(45) Date of Patent: Aug. 19, 2003

(54) GENERATION OF EXPOSURE DATA HAVING HIERARCHICAL STRUCTURE

(75) Inventor: Kazunori Koike, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/356,443

(22) Filed: Jul. 19, 1999

(30) Foreign Application Priority Data

Aug. 26, 1998 (JP) .............................. 10-240648

(51) Int. Cl.⁷ .............................................. G06K 15/00
(52) U.S. Cl. ........................ 358/1.1; 358/1.9; 358/3.2
(58) Field of Search .................... 358/1.1, 3.2, 536, 358/3.07, 3.16, 3.18, 1.2, 1.9

(56) References Cited

U.S. PATENT DOCUMENTS 5,701,560 A * 12/1997 Tsujita et al. ............... 399/159

* cited by examiner

Primary Examiner—Jerome Grant, II
(74) Attorney, Agent, or Firm—Staas & Halsey LLP

(57) ABSTRACT

A method of generating exposure data includes the steps of generating first exposure data representing a common portion shared by different exposure images, generating second exposure data representing portions which differ between the different exposure images, and defining at least one non-exposure area with regard to the first exposure data, the at least one non-exposure area corresponding to the portions that differ between the different exposure images and defining an area where no exposure is performed by the first exposure data.

13 Claims, 18 Drawing Sheets

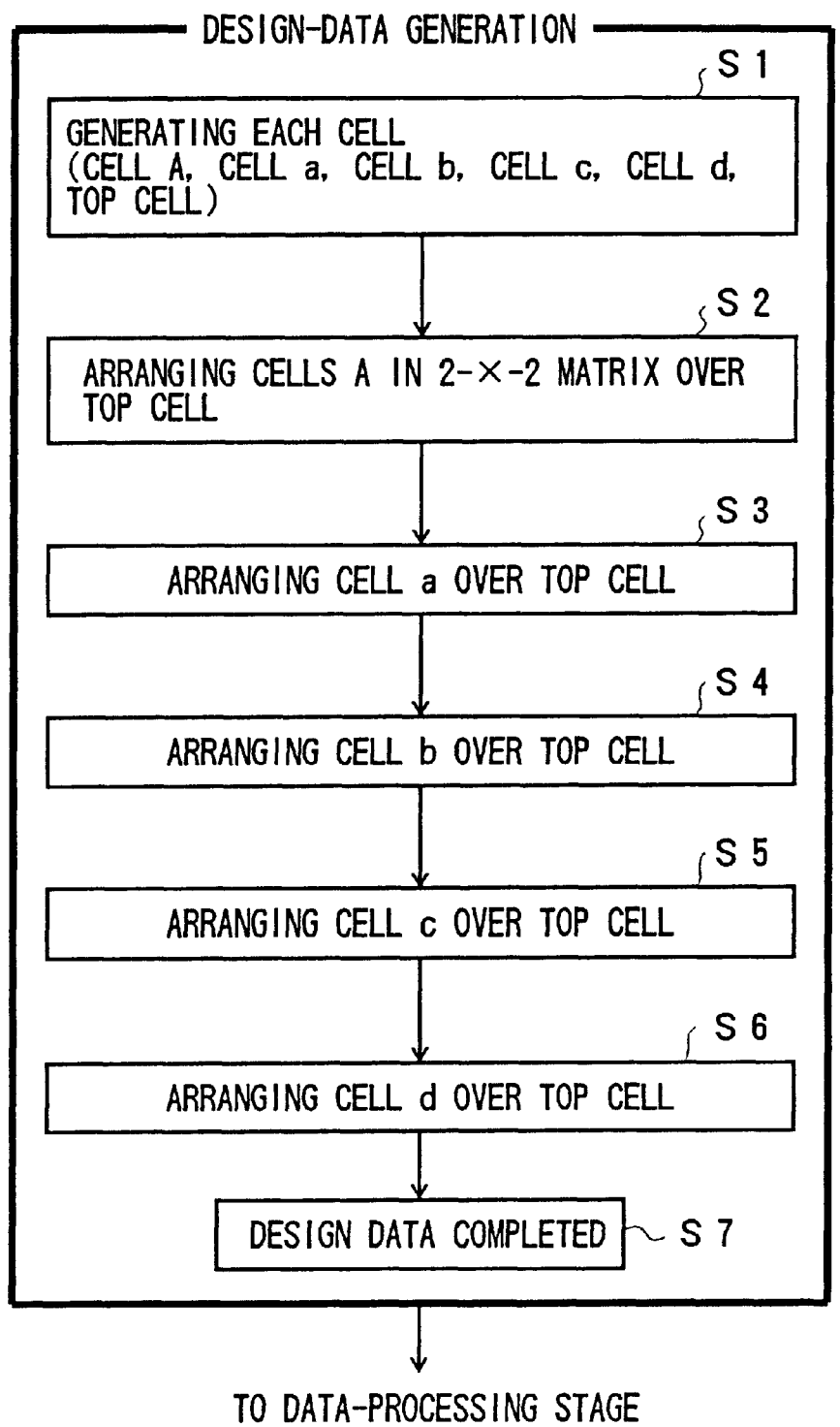

FIG. 5
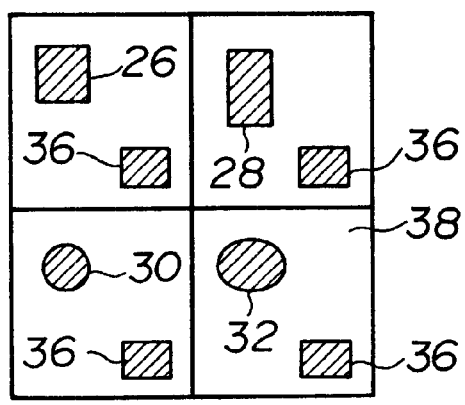
INVERTING DESIGN DATA TO
GENERATE EXPOSURE DATA
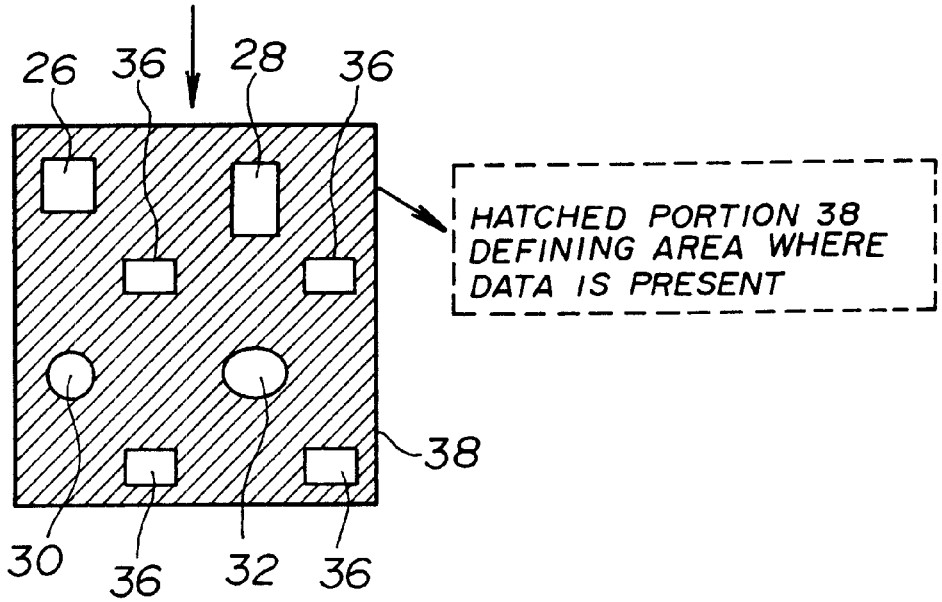

FIG. 9
DIVIDING DESIGN DATA INTO EACH CELL
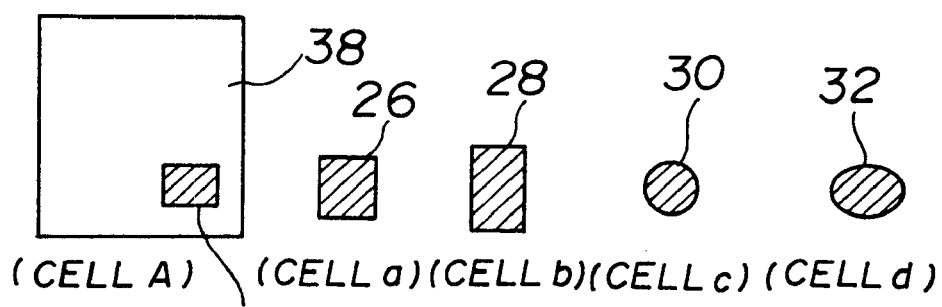
INVERTING DESIGN DATA TO GENERATE EXPOSURE DATA
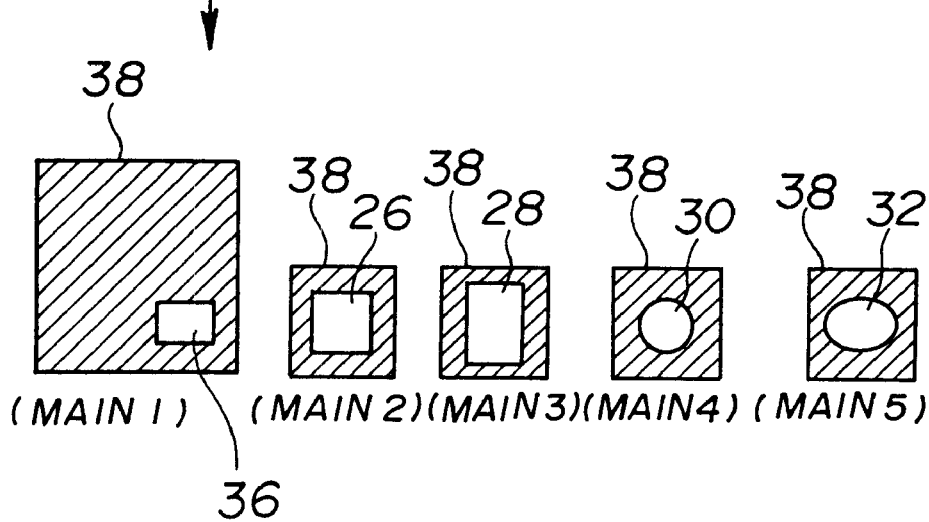

CELL A 24

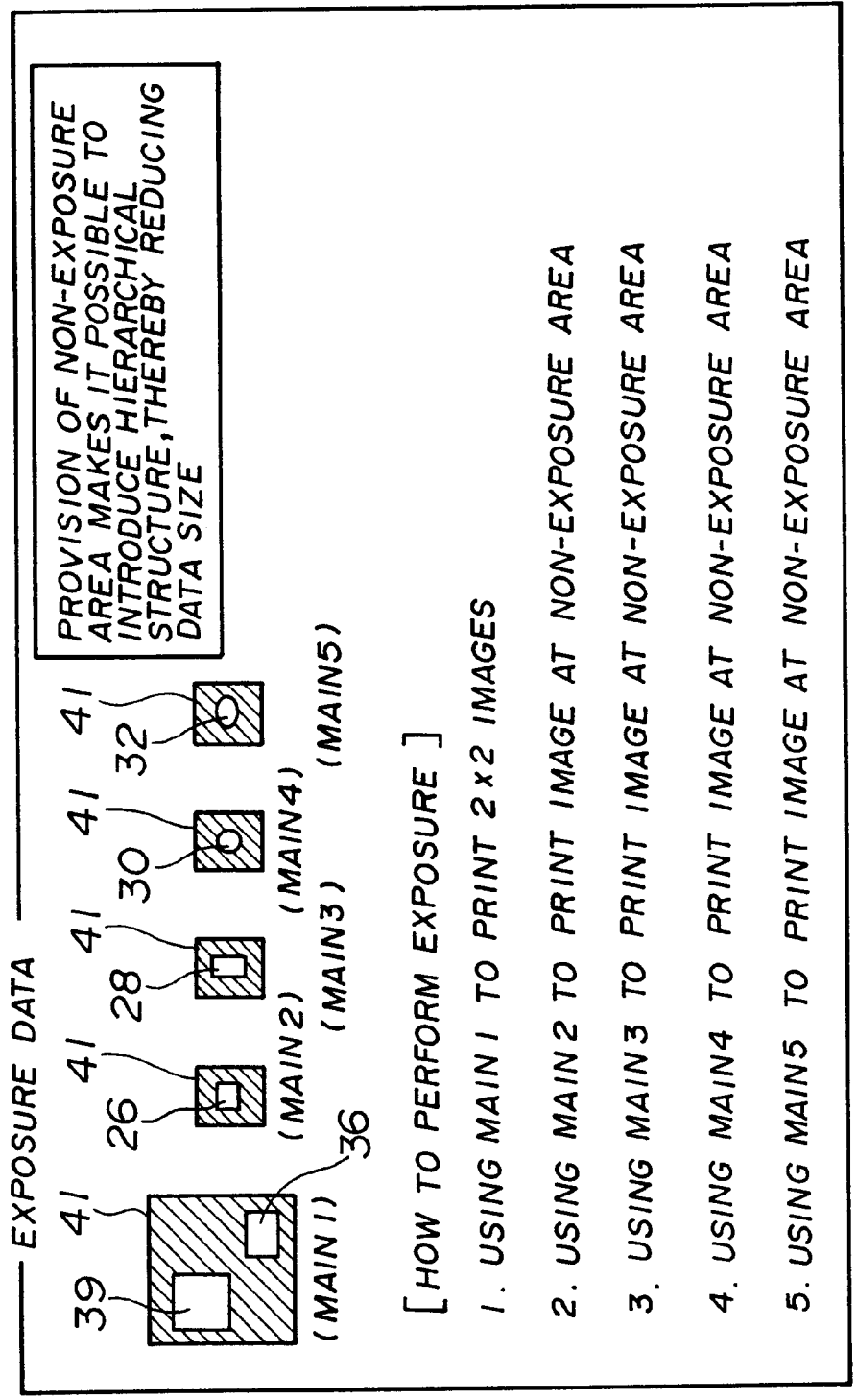

FIG. 17
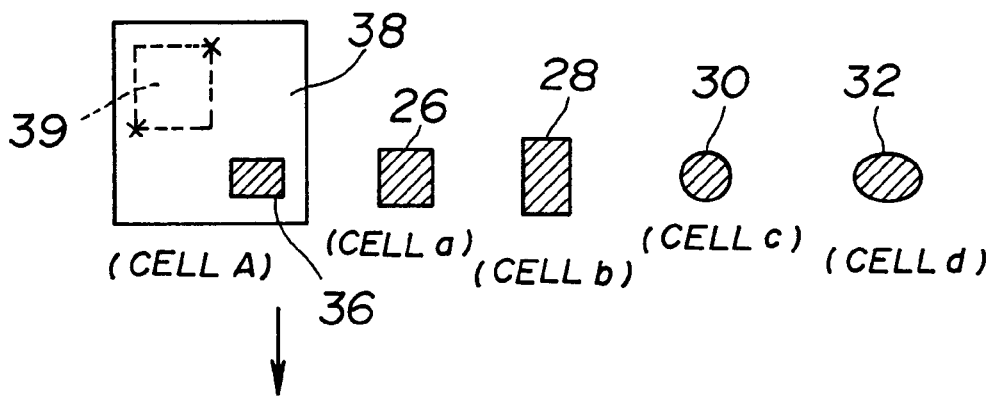
(DIVIDING DESIGN DATA)
INVERTING DESIGN DATA TO GENERATE EXPOSURE DATA
(EXCEPT FOR NON-EXPOSURE AREA)
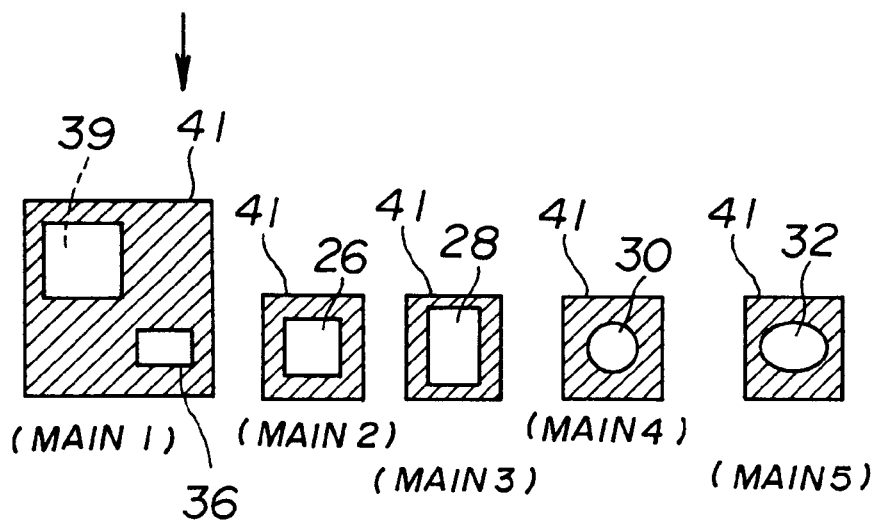

GENERATION OF EXPOSURE DATA HAVING HIERARCHICAL STRUCTURE

BACKGROUND OF THE INVENTION

1. Field of the Invention

The present invention generally relates to a method of generating exposure data, and particularly relates to a method of generating exposure data for use in designing a reticle mask.

Increases in circuit density of semiconductor integrated circuit have been brought about by rapid technological development, and integrated-circuit manufacturing devices are expected to demonstrate enhanced performance to satisfy the demand for a further increase in circuit density. In the art of fine process technology, more sophisticated techniques are required to keep up with increases in pattern density of integrated circuits.

The present invention is directed to a method of processing data which defines each pattern of a reticle when the reticle is designed by use of a CAD device. Here, the reticle is a mask used in an exposure process for manufacturing an integrated circuit.

Density of reticle patterns needs to be increased in order to increase circuit density, which results in an increase in an exposure-data size as the exposure data is used for patterning a reticle. When an efficiency of a process of generating a reticle is taken into consideration, a data processing method needs to be optimized. To this end, the exposure-data size needs to be reduced. Also, steps of generating exposure data and a method of processing data need to be simplified.

2. Description of the Related Art

It is a widely employed practice to use a CAD (computer aided design) device when designing a reticle mask (hereinafter referred to simply as a reticle). FIGS. 1 through 3F are illustrative drawing showing a procedure for designing a reticle by using a CAD device.

A related-art procedure for designing a reticle by using a CAD device will be described below.

As shown in FIG. 1, a host computer 10 of a CAD system sends design data 16 to a data processing unit 12. The data processing unit 12 converts the design data 16 into exposure data 18, and sends the exposure data 18 to the exposure unit 14. At a time of exposure, light emitted form a light source 21 is controlled by a polarization plate 22 in terms of an exposure position thereof on a reticle 23.

A pattern formed in a reticle is comprised of figures which serve as a unit element constituting the pattern. A figure or a set of figures is called a cell. A plurality of cells together constitute a pattern in the reticle.

When an exposure device is to form various patterns on a semiconductor device, figures constituting each of these patterns are drawn on the reticle. As a result, the reticle ends up having areas with figures and blank areas without figures. In order to generate figures, data representing the figures is allocated by the CAD device to positions where figures are supposed to be present. The data obtained after such positional allocation is called exposure data, and constitutes cells. The blank areas without figures do not have data allocated thereto, and are called non-exposure areas.

A procedure for generating exposure data in the related art will be described with reference to accompanying drawings.

In order to generate exposure data, design data needs to be generated first that serves as a basis of the exposure data.

FIG. 2 is a flowchart of a process of generating design data. FIGS. 3A through 3F are illustrative drawings showing the way the data is generated in each cell at each step of the process of FIG. 2.

In FIGS. 3A through 3F, a blackened area in each cell indicates where design data exists, and areas without a black mark do not have design data allocated thereto. In FIGS. 3A through 3F, a TOP cell is a cell at the highest level in a hierarchy, and cells a through d belong to the next highest level. All the cells together form a library. It should be noted that the TOP cell does not have any design data therein, and that the cells a through d is provided with respective design data.

At a step S1 in FIG. 2, a cell A and the cells a through d are generated, where the cells a through d have respective design data generated therein. Namely, as shown in FIG. 3A, the cell A is provided with design data 36, and the cells a through d are provided with design data 26, 28, 30, and 32, respectively.

At a step S2 in FIG. 2, the cells A (24) are arranged in a 2-by-2 matrix at a lower level under a TOP cell 34 by arranging the design data 36. This is shown in FIG. 3B.

At a step S3 in FIG. 2, as shown in FIG. 3C, the design data 26 of the cell a is generated in one of the cells A (24) arranged at the lower level under the TOP cell 34.

At a step S4 in FIG. 2, as shown in FIG. 3D, the design data 28 of the cell b is generated in one of the cells A (24) arranged at the lower level under the TOP cell 34.

At a step S5 in FIG. 2, as shown in FIG. 3E, the design data 30 of the cell c is generated in one of the cells A (24) arranged at the lower level under the TOP cell 34.

At a step S6 in FIG. 2, as shown in FIG. 3F, the design data 32 of the cell d is generated in one of the cells A (24) arranged at the lower level under the TOP cell 34.

FIG. 4A is a flowchart of a process of generating exposure data based on the design data which is created as described above. The exposure data is to be used when patterning of a reticle is carried out.

As shown in FIG. 4A, the design data generated by the steps S1 through S6 of FIG. 2 as shown in FIGS. 3A through 3F is inverted by a design-data inverting device (will be described later) to generate exposure data.

FIG. 4B is an illustrative drawing for explaining the inversion of design data.

When a pattern is actually formed on a reticle, the pattern needs to permit a passage of light in the areas where the design data 36, 26, 28, 30, and 32 are present as shown in FIG. 4B. For this purpose, the design data should be inverted. Namely, the exposure data is created in an area 38 where the design data is not present, and is not created in the areas 36, 26, 28, 30, and 32 where the design data is present.

FIG. 5 is a flow diagram showing the way the design data is converted into the exposure data through inversion of the design data. Each step of FIG. 4A corresponds to each step of FIG. 5.

A reticle pattern is created based on the exposure data generated as described above, and is then used to expose posi-resist on a semiconductor substrate to exposure light at the black portion of FIG. 5 where the exposure data exists (i.e., the area 38 shown at the step S3). This exposure process results in a photoresist pattern being formed. During generation of the design data as described above, the design data is processed as data having a hierarchical structure. The exposure data, on the other hand, is not processed as data having a hierarchical structure. This results in an increase in a data size of the exposure data.

In general, when data items of a given data group need to be stored as files, each data item is stored as a separate file if each data item is different. In this case, there is no hierarchical structure. When some of the data items share common data, sharing of the common data can be reflected in a file structure by introducing a hierarchy. The larger the number of data items, the more efficient the introduction of a hierarchy can be.

In the related-art method of generating exposure data as previously described, the exposure data of each cell has a different configuration, and this prevents hierarchical data processing. When every single cell has to possess exposure data including a common data portion, the exposure-data size increases in proportion to an increase in the number of matrix. This leads to a massive data size of the exposure data. Also, the number of data processing steps for generating the exposure data will increase. Because of all of this, the related-art method of generating the exposure data is not preferable when an efficiency is taken into consideration.

In what follows, a description will be given with regard to problems encountered when the hierarchical processing is introduced to the related-art method of generating exposure data.

FIG. 6 is a flowchart showing a method of generating the design data, and FIGS. 7A through 7F are illustrative drawings showing the way the design data is arranged at each step of FIG. 6. In this related-art method, the cells a through d are arranged on the matrix provided within the TOP cell in the same manner as in the method described in connection with FIG. 2 and FIGS. 3A through 3F.

Instead of generating exposure data from the design data generated in this manner, hierarchical data processing can be applied as in the following manner whatever the efficacy of such an application may be.

FIG. 8A is a flowchart of a process of generating exposure data based on design data while each cell is treated separately, and FIG. 8B is an illustrative drawing for explaining the cell-wise inversion of design data to generate the exposure data.

FIG. 9 is a flow diagram showing the way the design data of each cell is converted into the exposure data while each cell is treated separately.

As shown in FIG. 9, the cell A and the cells a through d, which would be arranged in a 2-by-2 matrix in the above-mentioned method of generating the design data, are treated separately, and the design data of each of these cells is inverted to generate data MAIN1 through MAIN5.

After this, the exposure data MAIN1 is arranged in a 2-by-2 matrix at a lower level under the TOP cell, and the exposure data MAIN2 through MAIN5 are superimposed on the exposure data MAIN1 in the same manner as in the method of generating design data. Since superimposition of the exposure data results in double exposure, however, an appropriate exposure process cannot be carried out in such a configuration. In reality, therefore, hierarchical data processing cannot be implemented.

Accordingly, there is a need for a scheme for hierarchical data processing which is workable, can reduce an exposure-data size, and can simplify the data processing steps of generating exposure data.

SUMMARY OF THE INVENTION

Accordingly, it is a general object of the present invention to provide a scheme for hierarchical data processing which can satisfy the needs described above.

It is another and more specific object of the present invention to provide a scheme for hierarchical data processing which is workable, can reduce an exposure-data size, and can simplify the data processing steps of generating exposure data.

In order to achieve the above objects according to the present invention, a method of generating exposure data includes the steps of generating first exposure data representing a common portion shared by different exposure images, generating second exposure data representing portions which differ between the different exposure images, and defining at least one non-exposure area with regard to the first exposure data, the at least one non-exposure area corresponding to the portions that differ between the different exposure images and defining an area where no exposure is performed by the first exposure data.

In the method as described above, exposure data is created to reflect a hierarchical structure thereof. Namely, the first exposure data represents the common-data portion shared by the different exposure images, which may be arranged in a matrix form, for example. The portions that differ between these exposure images are represented by the second exposure data. Such separation of data reflecting its hierarchical structure is made possible by use of the non-exposure area. Since the common-data portion is extracted and can be stored as a file, there is no need to store the entire exposure data as a single data file as in the related-art scheme by retaining its matrix form, for example. Therefore, the present invention reduces the data size of the exposure data by a significant amount compared to the related-art scheme.

According to another aspect of the present invention, a method of printing a pattern on a reticle by using exposure data includes the steps of generating first exposure data representing a common portion shared by different exposure images, generating second exposure data representing portions which differ between the different exposure images, defining at least one non-exposure area with regard to said first exposure data, said at least one non-exposure area corresponding to the portions that differ between the different exposure images and defining an area where no exposure is performed by said first exposure data, printing an image of the common portion on the reticle as many times as there are the different exposure images by using said first exposure data with no exposure being performed at said at least one non-exposure area, and printing images of said second exposure data at the portions which differ between the different exposure images.

In the method described above, the first exposure data is used for printing the image of the common portion with respect to each of the exposure images while the non-exposure area is left unprinted, and the second exposure data is used for printing the images of the different portions at the non-exposure area in each of the exposure images. In this manner, an appropriate printing process is performed without getting a trouble of double exposure while the exposure data is provided in a hierarchical structure.

Other objects and further features of the present invention will be apparent from the following detailed description when read in conjunction with the accompanying drawings.

BRIEF DESCRIPTION OF THE DRAWINGS

FIGS. 1 through 3F are illustrative drawing showing a procedure for designing a reticle by using a CAD device;

FIG. 5 is a flow diagram showing the way the design data is converted into the exposure data through inversion of the design data;

FIG. 9 is a flow diagram showing the way the design data of each cell is converted into the exposure data while each cell is treated separately;

FIG. 16B is an illustrative drawing for explaining generation of the exposure data when the design data has an non-exposure area therein; and FIG. 17 is a flow diagram showing the way the design data of each cell is converted into the exposure data when the design data has an non-exposure area therein.

DESCRIPTION OF THE PREFERRED EMBODIMENTS

In the following, embodiments of the present invention will be described with reference to the accompanying drawings.

A method of generating exposure data includes a step of generating design data by use of a CAD device and a step of converting the design data into exposure data by use of an image-conversion processing device.

The step of generating design data by use of a CAD device and the step of converting the design data into exposure data will be described in the following.

Figure 1:
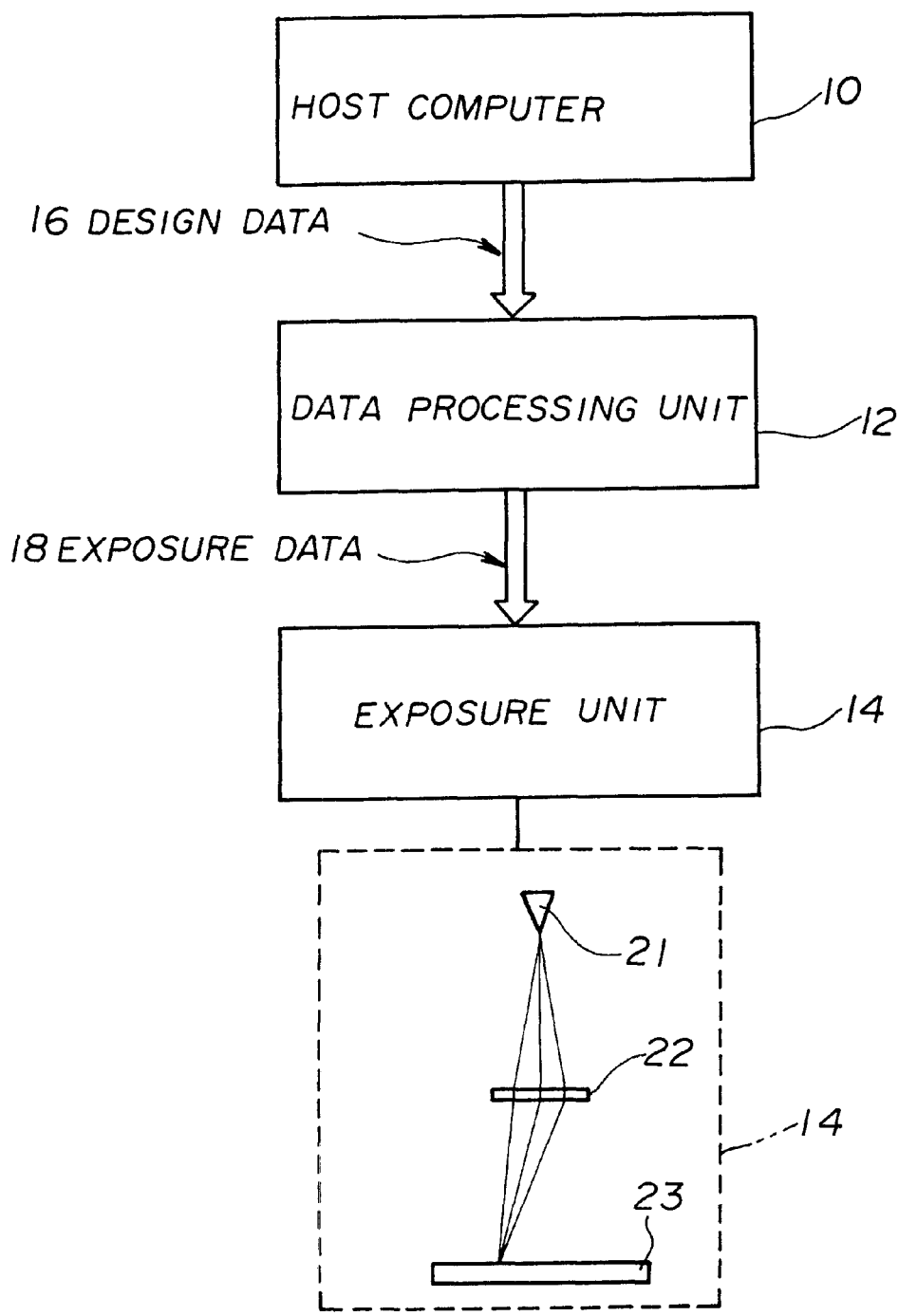
Figure 3A:
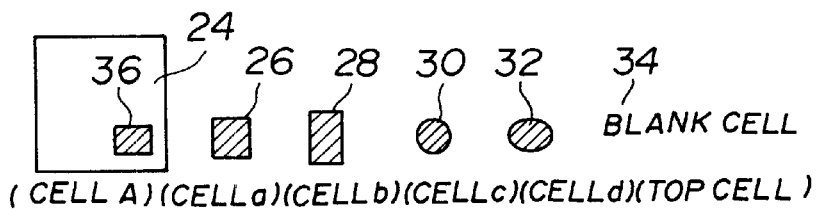
Figure 3B:
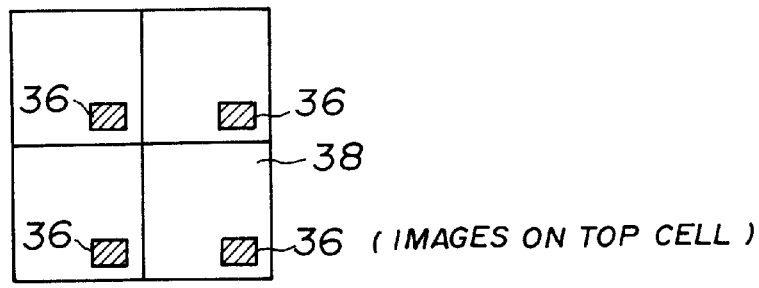
Figure 3C:
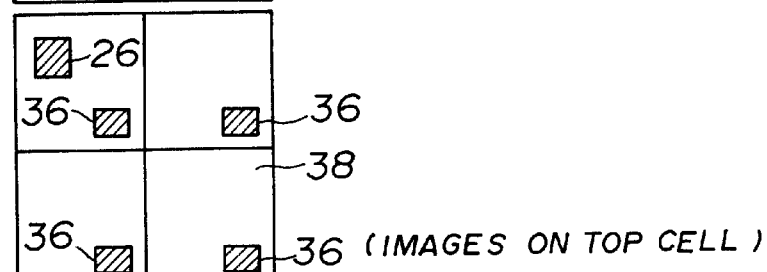
Figure 3D:
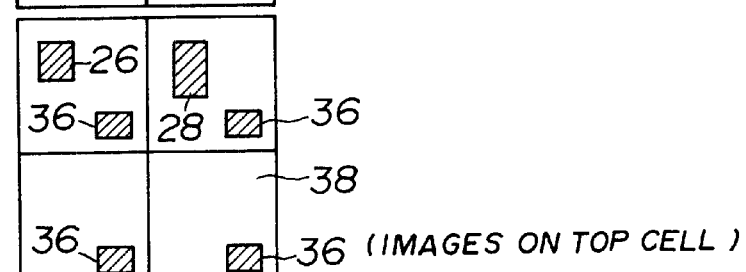
Figure 3E:
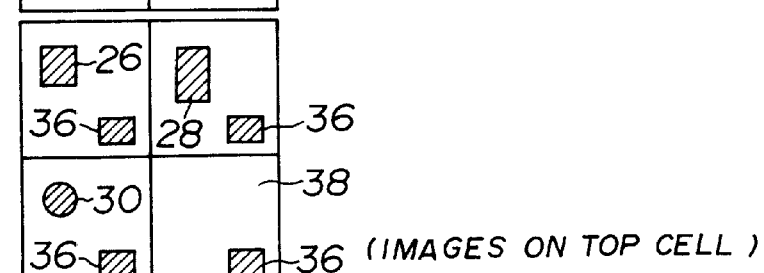
Figure 3F:
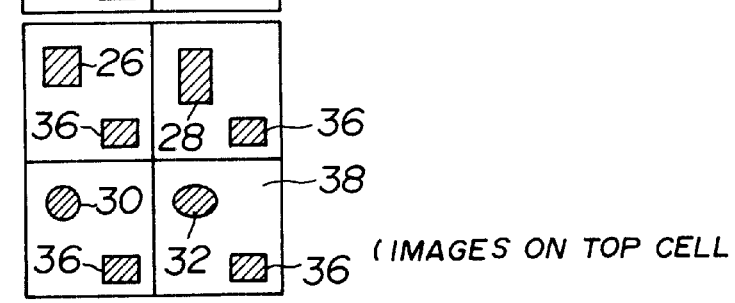
Figure 4A:
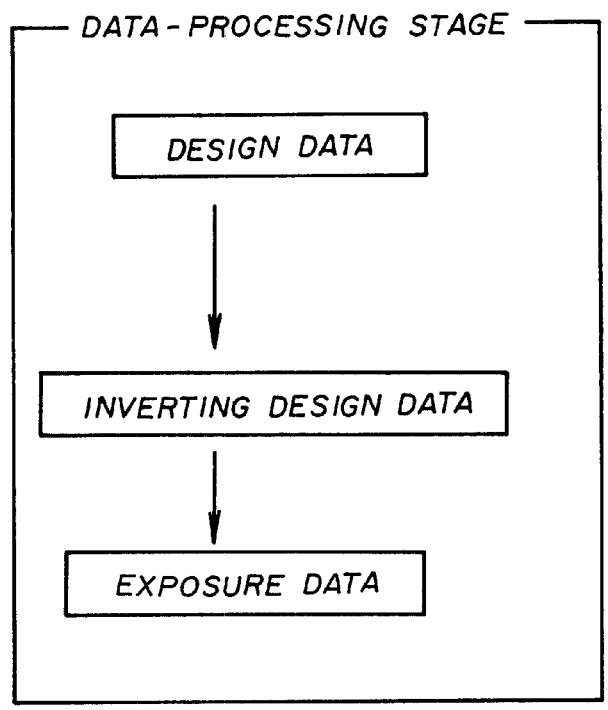
FIG. 4A is a flowchart of a process of generating exposure data based on design data.
Figure 4B:
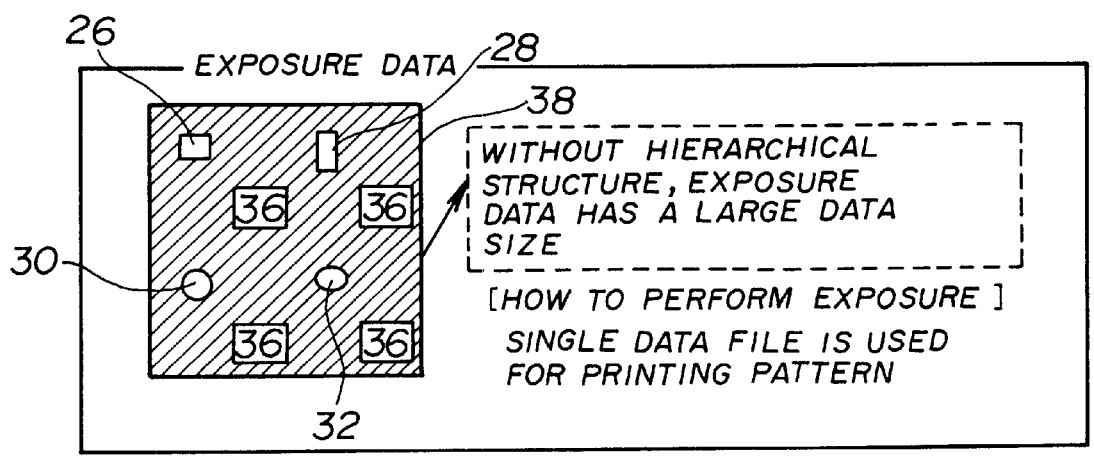
FIG. 4B is an illustrative drawing for explaining inversion of design data
Figure 6:
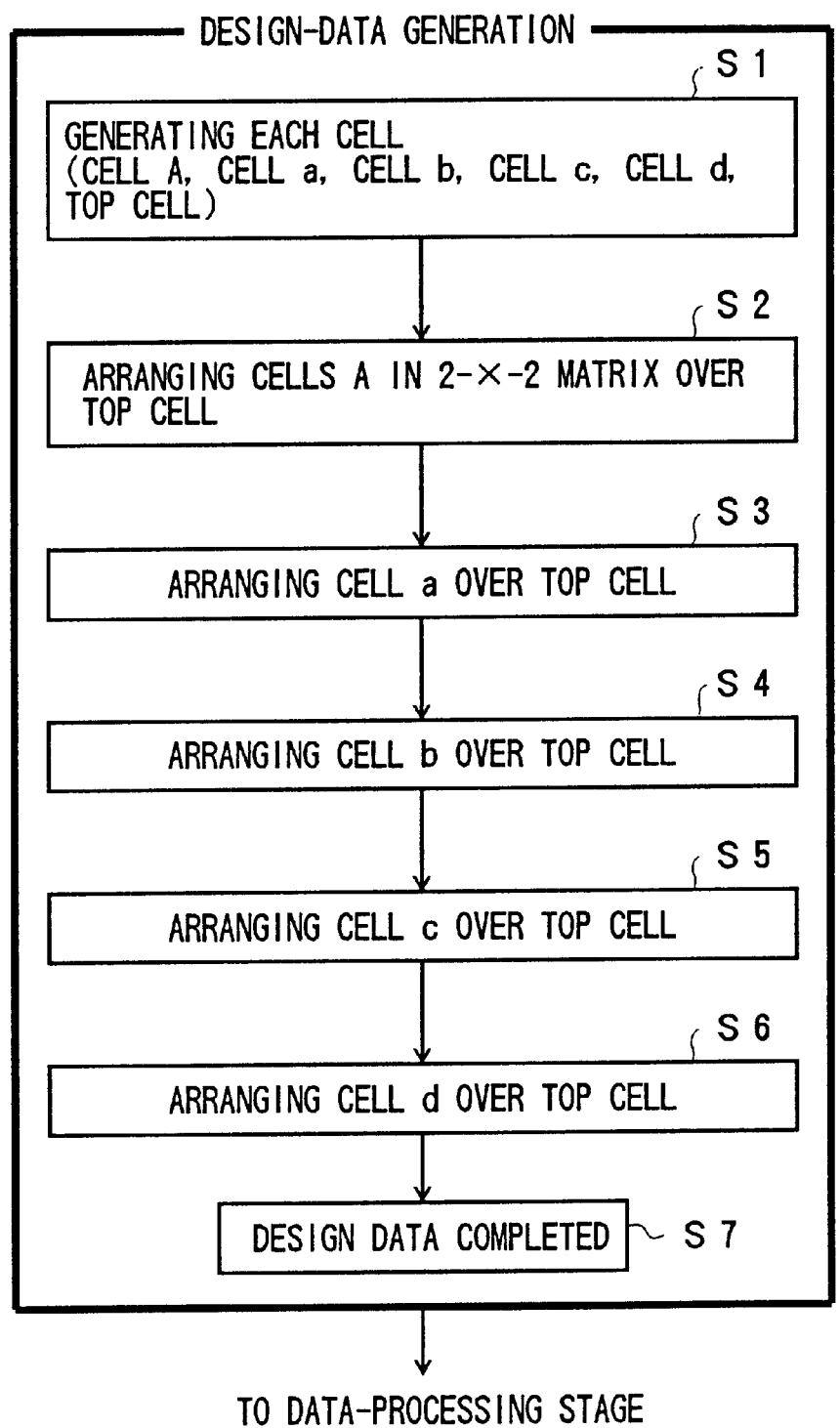
FIG. 6 is a flowchart showing a method of generating the design data.
Figure 7A:
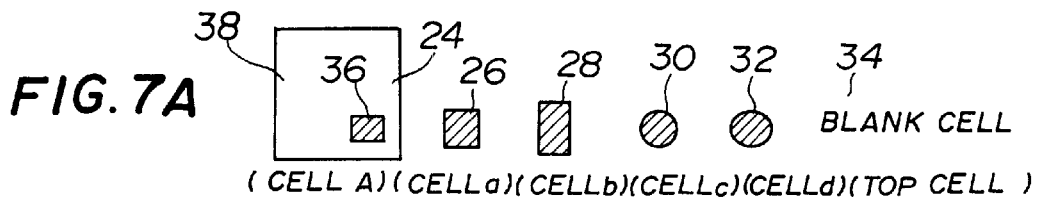
FIGS. 7A through 7F are illustrative drawings showing the way the design data is arranged at each step of FIG. 6.
Figure 7B:
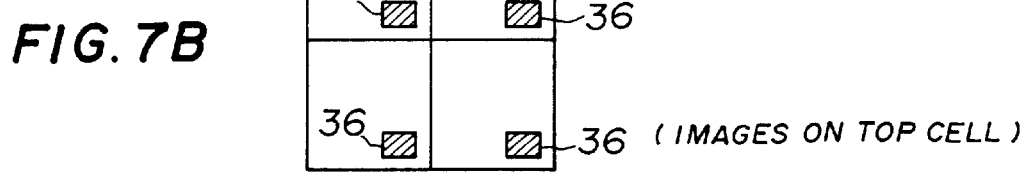
Figure 7C:
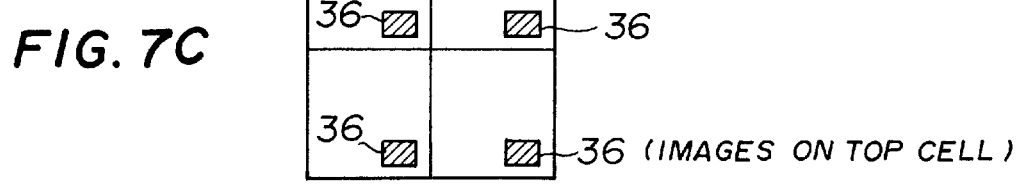
Figure 7D:
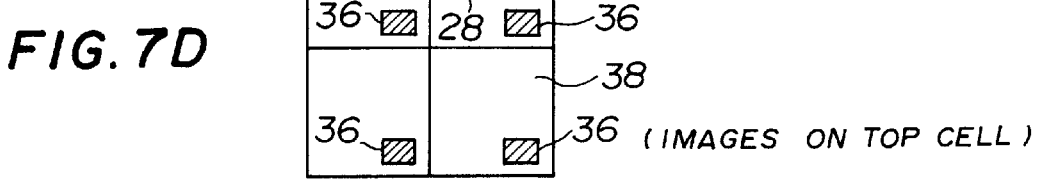
Figure 7E:
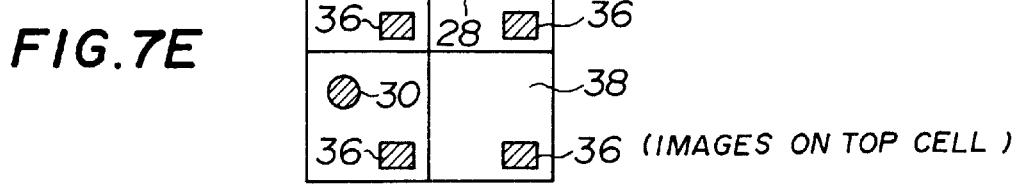
Figure 7F:
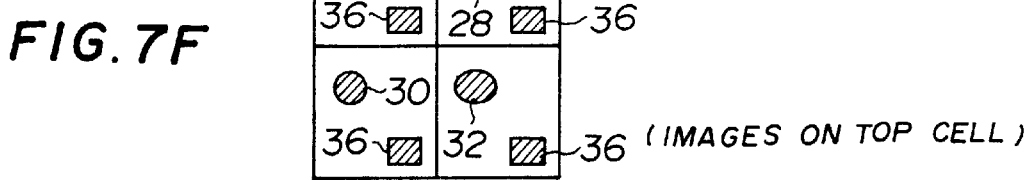
Figure 8A:
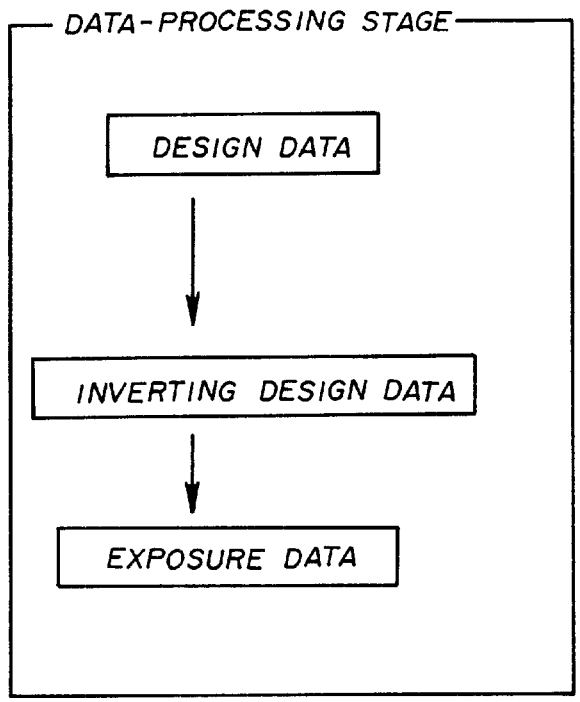
FIG. 8A is a flowchart of a process of generating exposure data based on design data while each cell is treated separately.
Figure 8B:
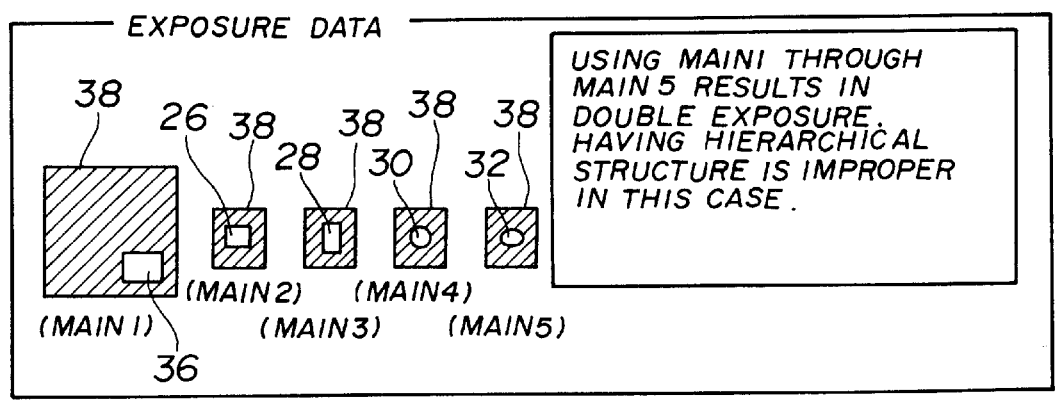
FIG. 8B is an illustrative drawing for explaining cell-wise inversion of design data to generate exposure data.
Figure 10:
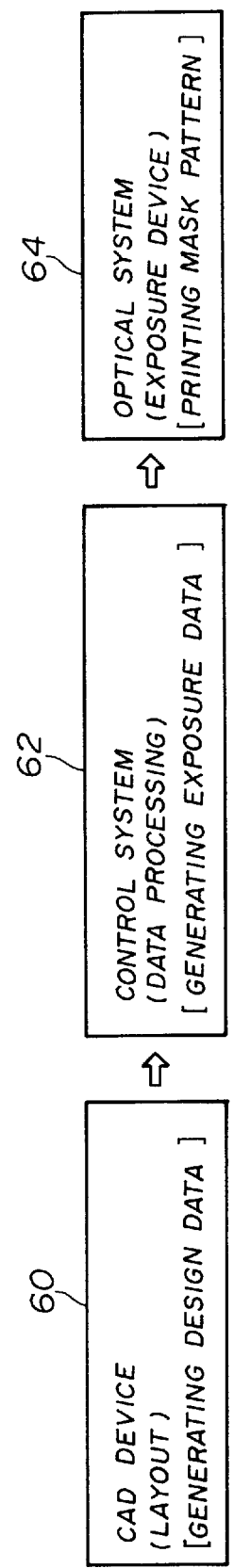
FIG. 10 is an illustrative drawing showing a data flow in the process of generating exposure data.

FIG. 10 is an illustrative drawing showing a data flow in the process of generating exposure data.

A CAD device 60 generates design data which serves as a basis for exposure data. The design data defines a pattern layout. An image processing device 62, which serves as a control system for controlling an exposure process, converts the design data generated by the CAD device 60 into exposure data.

Based on the exposure data, an exposure device 64 serving as an optical system performs an exposure process to print a pattern on a reticle.

The data processing of the CAD device 60 and the image processing device 62 will be described in the following.

Figure 11:
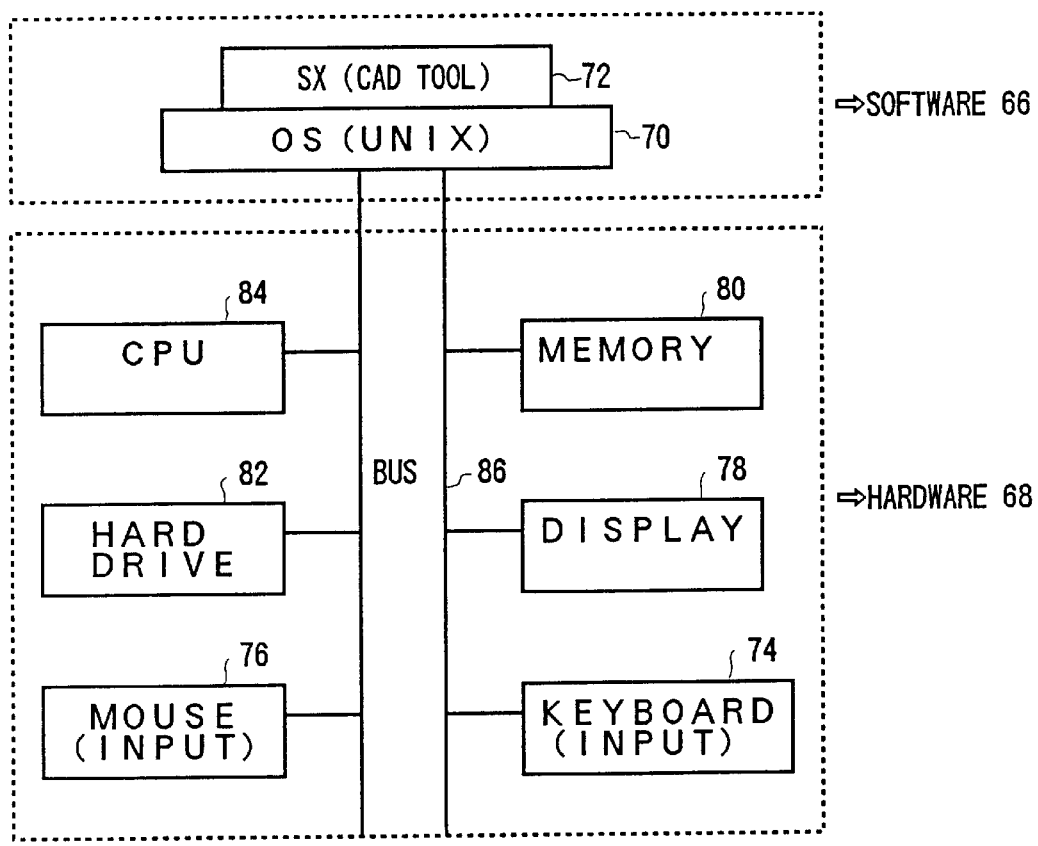
FIG. 11 is a block diagram showing a schematic configuration of a CAD device used for designing pattern layouts.

FIG. 11 is a block diagram showing a schematic configuration of the CAD device 60 used for designing pattern layouts.

The CAD device 60 includes a software portion 66 and a hardware portion 68.

The software portion 66 includes an operation system 70 which may be UNIX and an application program 72 which may be a software package called SX.

The hardware portion 68 mainly includes a keyboard 74 and a mouse 76 serving as an input device, a display 78 for displaying data on a screen, a memory 80 serving as a temporal storage of input data, a hard drive 82 storing the input data and processed data, and a CPU (central processing unit) 84 which attends to processing of the input data and other data.

These elements of the CAD device 60 function in such a manner as described below.

The mouse 76 and/or the keyboard 74 receive input data. The input data is displayed on the display 78, and is temporarily stored in the memory 80. The CPU 84 performs data processing on the input data, and the processed data is stored in the hard drive 82.

The step of generating design data by using the CAD device 60 having the configuration and functions as described above will be carried out as in the following.

The input data from the keyboard 74 and the mouse 76 is displayed on the display 78, and is temporarily stored in the memory 80. Using functions of the application software 72 (SX), specific instructions for specific data processing are supplied via a bus 86 so as to create design data defining a layout pattern. The design data is stored in the hard drive 82.

The step of converting the design data into the exposure data by use of the image processing device 62 will be described in the following.

Figure 12:
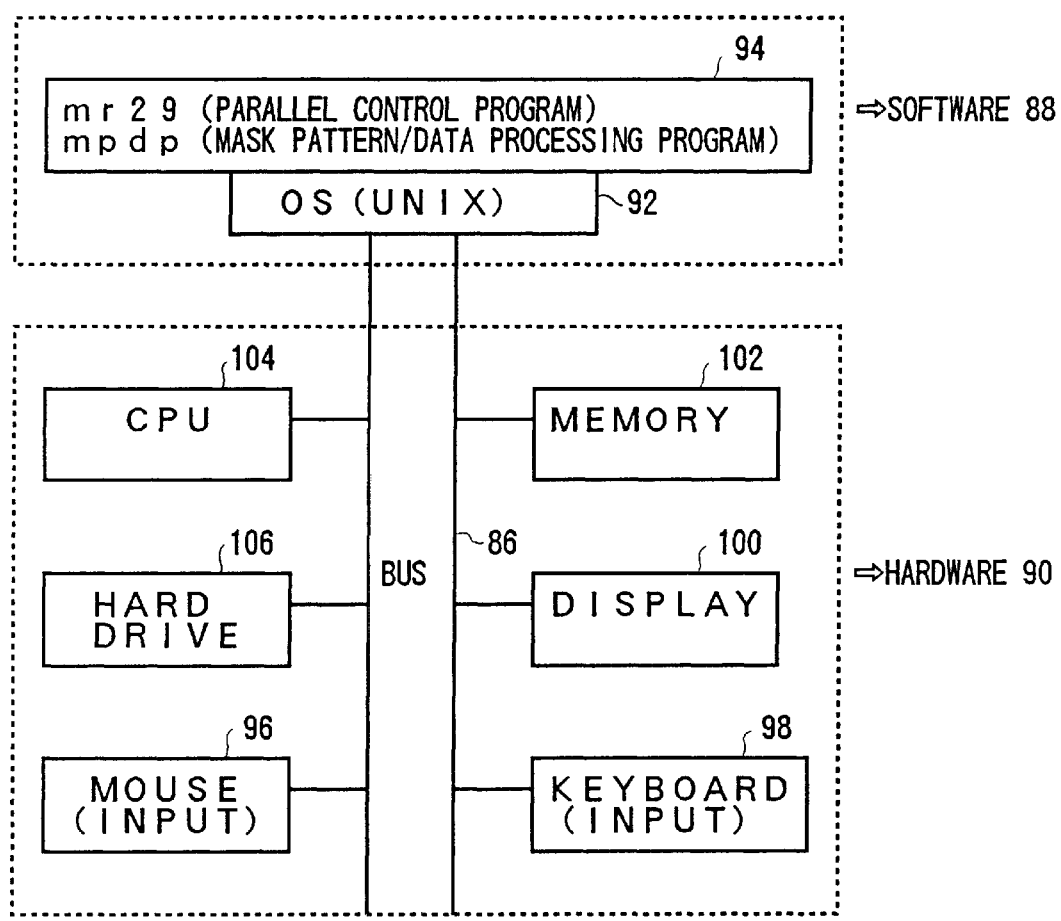
FIG. 12 is a block diagram showing a schematic configuration of an image processing device used for converting design data to exposure data.

FIG. 12 is a block diagram showing a schematic configuration of the image processing device 62 used for converting design data to exposure data.

The image processing device 62 includes a software portion 88 and a hardware portion 90.

The software portion 88 includes an operation system 92 (e.g., UNIX) and application-program software 94 which may be comprised of a parallel-control program such as mr29 and a mask-pattern-data processing program such as mpdp.

The hardware portion 90 of the image processing device 62 has the same configuration as that of the CAD device 60.

The step of converting design data into exposure data will be performed as in the following by the functions of the image processing device 62.

Data-processing conditions, which are input via a mouse 96 and/or a keyboard 98, are displayed on a display 100, and are temporarily stored in a memory 102. The design data is transferred from the CAD device 60 to the image processing device 62, and a CPU 104 attends to data processing under the data-processing conditions of the input data so as to convert the design data to exposure data. The exposure data obtained in this manner is stored in a hard drive 106.

In what follows, a scheme which reduces a data size of exposure data will be described.

In this scheme, a common portion shared by all the cells is extracted from exposure data and treated as a common file. Further, an area of exposure data which differs from cell to cell is defined as a non-exposure area, and each exposure data differing from cell to cell is patched into the non-exposure area of each cell.

Figure 13:
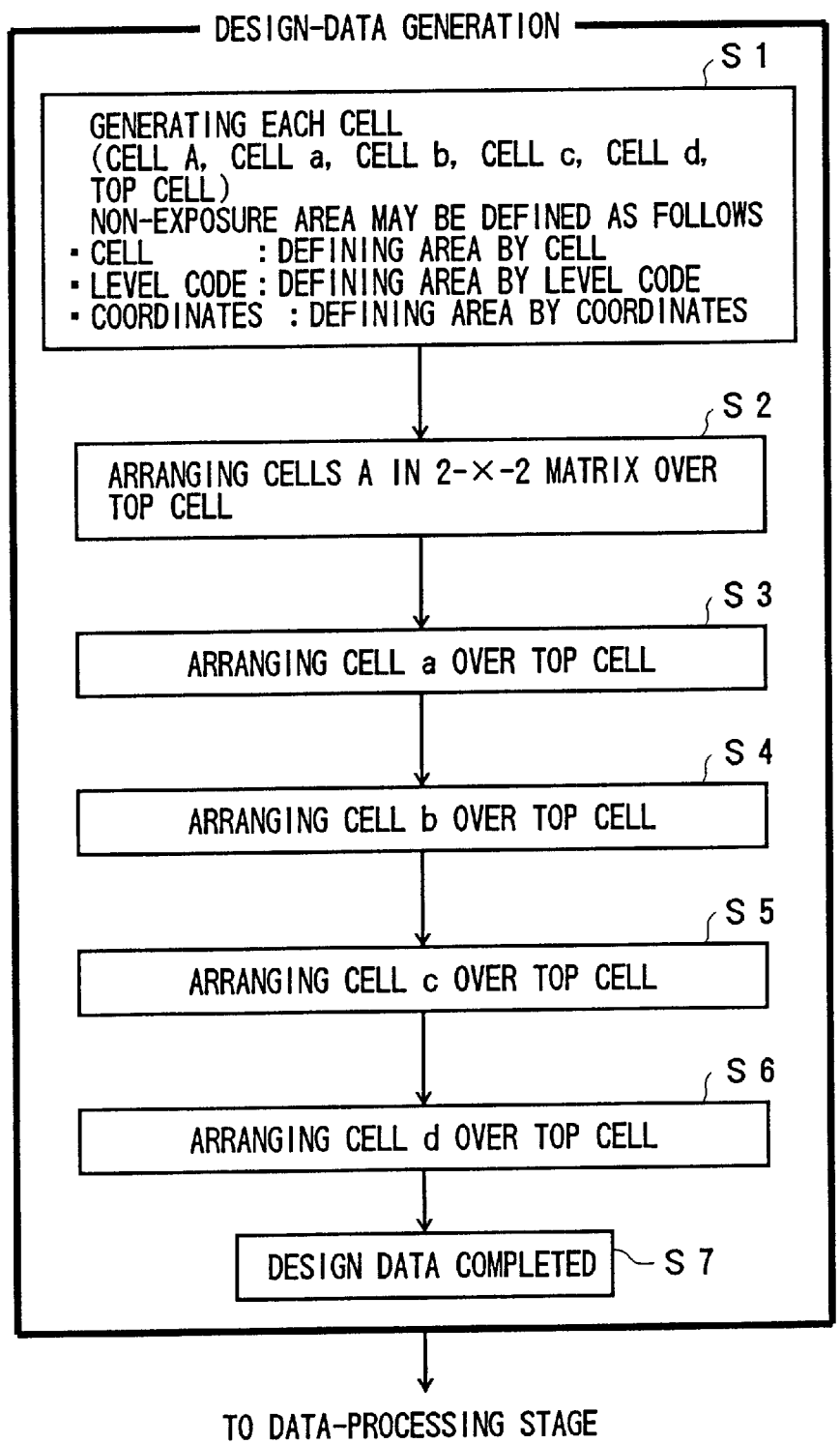
FIG. 13 is a flowchart of a method of generating a design data according to an embodiment of the present invention.

FIG. 13 is a flowchart of a method of generating a design data according to an embodiment of the present invention. FIGS. 14A through 14F are illustrative drawings showing the way the design data is created at each step of FIG. 13.

In this embodiment, there are three different variations as to how a non-exposure area is defined in each area, and the three variations are shown at step S1 of FIG. 13.

The first variation is to define a non-exposure area by coordinates. Defining an area by use of coordinates may fit well in a pattern designing process of a CAD device. Definition of a non-exposure area based on coordinates in this embodiment, however, is more than just something that fits well in CAD designing, but is designed to be simple.

Figure 14A:
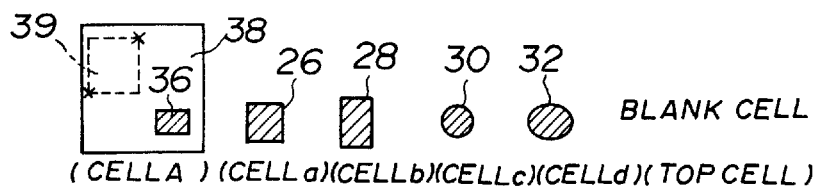
FIGS. 14A through 14F are illustrative drawings showing the way the design data is created at each step of FIG. 13.

As shown in FIG. 14A, a non-exposure area 39, which is a rectangle shown by dashed lines, is defined by coordinates of two vertexes that face each other across a diagonal of a rectangle. A specific example of such definition will be provided later in detail. In this manner, a non-exposure area, which covers an infinite number of coordinates in the CAD device, is defined by coordinates of only two points. This enhance efficiency of the designing process.

The second variation is to define a non-exposure area as a cell. That is, a cell is defined with a name thereof to represent the non-exposure area.

In the second variation, there is no need to specify coordinates as in the first variation when indicating a non-exposure area. Specifying a cell name is all that needs to be done in order to indicate a non-exposure area, thereby simplifying and making more efficient the process of generating the exposure data.

Rather than indicating a non-exposure area by using the coordinates of two points such as (1, 2) and (3, 4), a name "cell a" may be given to define a cell that represents a non-exposure area. In this manner, a non-exposure area can be specified by a single name rather than by four numerical values representing coordinates. This serves to reduce a data size that is necessary for indicating a non-exposure area.

The third variation is to define a non-exposure area by a level code.

A level code is a single number that is used for defining a pattern in a CAD system, and a plurality of level codes such as 1 through 256 can be defined to allow an operator to indicate a plurality of different patterns. Most of the conventional CAD system is provided with this function. Use of this function in specifying a non-exposure area further simplify the process of generating the exposure data.

For example, a single number "1" may be specified to indicate a non-exposure area rather than using the coordinates of two points such as (1, 2) and (3, 4). In this manner, a non-exposure area can be specified by using a single number rather than by using four numerical values representing coordinates. This serves to reduce a data size that is necessary for indicating a non-exposure area.

In the following, the step of allocating exposure data to a non-exposure area will be described with reference to FIG. 13 and FIGS. 14A through 14F.

Figure 14B:
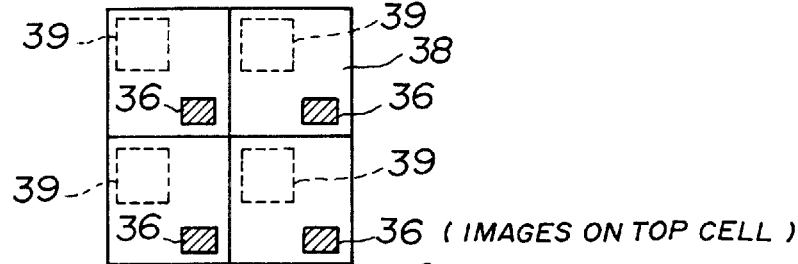

At a step S2 of FIG. 13, as shown in FIG. 14B, the four cells A each having the design data 36 are arranged in a 2-by-2 matrix. A non-exposure area 39 of each of the cells A is patched by the cells a through d having respective design data in the following steps S3 through S6.

The non-exposure area 39 of a given one of the cells A is shown by dotted lines in FIG. 14B, and is treated as an area which is not going to have exposure data therein. Accordingly, when the design data is inverted to produce exposure data, the non-exposure area 39 is not inverted, and, thus, ends up having no exposure data therein. Because of this, the exposure data of the cells a through d can be patched into the non-exposure area 39. Further, the exposure data of a common portion shared by all the cells A is stored as a common file of a given level in a hierarchy, while the exposure data of patterns that are unique to respective cells is stored as files of a next level. In this manner, hierarchical processing can be achieved.

Figure 15:
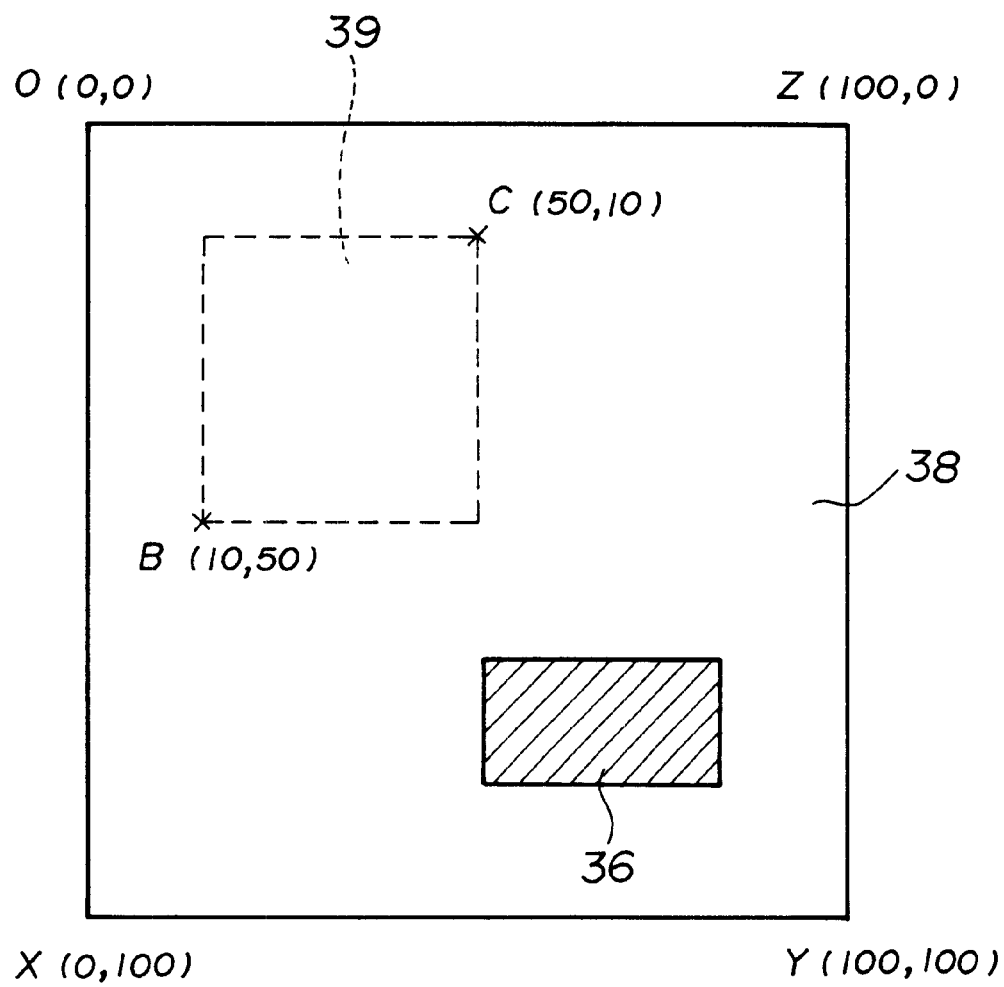
FIG. 15 is an illustrative drawing showing a definition of a non-exposure area based on coordinates.

FIG. 15 is an illustrative drawing showing a definition of a non-exposure area based on coordinates.

As shown in FIG. 15, coordinate axes are provided for a cell A, and the non-exposure area 39 is defined by using coordinates according to these axes. In any one of the cells A arranged in a matrix, the non-exposure area 39 is defined as an area having the same relative position within the cell A. The common portion is treated as data at a given level, and the exposure data unique to each cell are treated as data at the next level in the hierarchy.

In FIG. 15, the cell A is defined as a rectangular OXYZ. O(0, 0) is an origin, and the remaining points X, Y, and Z have coordinates (0, 100), (100, 100), and (100, 0), respectively. The non-exposure area 39 has a rectangular shape shown by dotted lines, and is defined by two points B(10, 50) and C(50, 10). Since the non-exposure area 39 by its definition is not going to have exposure data, it is not inverted when the design data is converted into the exposure data.

A file of the cell A includes the design data 36, and this data is the only one which should be stored in the file of cell A. The remaining area does not have any data that requires storage thereof. In this manner, provision of the non-exposure area as shown by the dotted lines makes it possible to reduce a memory space necessary for data storage in the CAD device.

Figure 14C:
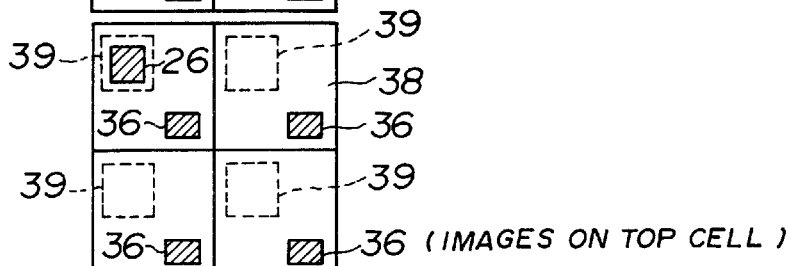
Figure 14D:
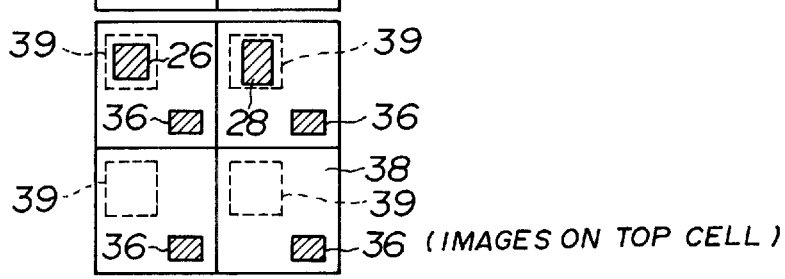
Figure 14E:
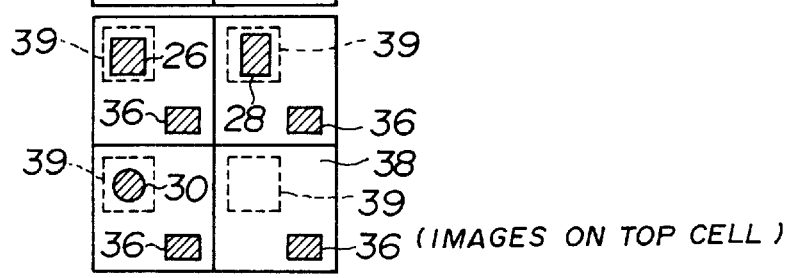
Figure 14F:
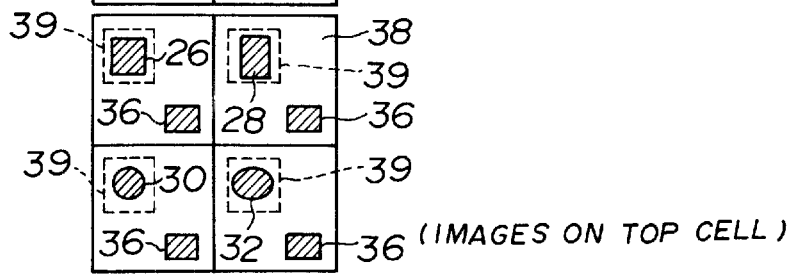

At a step S3 of FIG. 13, as shown in FIG. 14C, the cell a is patched into the non-exposure area 39 of one of the cells A (24). At a step S4 of FIG. 13, as shown in FIG. 14D, the cell b is allocated to the non-exposure area 39 of one of the cells A. At a step S5 of FIG. 13, as shown in FIG. 14E, the cell c is patched into the non-exposure area 39 of one of the cells A (24). At a step S6 of FIG. 13, as shown in FIG. 14F, the cell d is allocated to the non-exposure area 39 of one of the cells A. In this manner, the arrangement of the design data is completed.

In the following, the step of generating the exposure data by use of the image processing device 62 will be described.

Figure 16A:
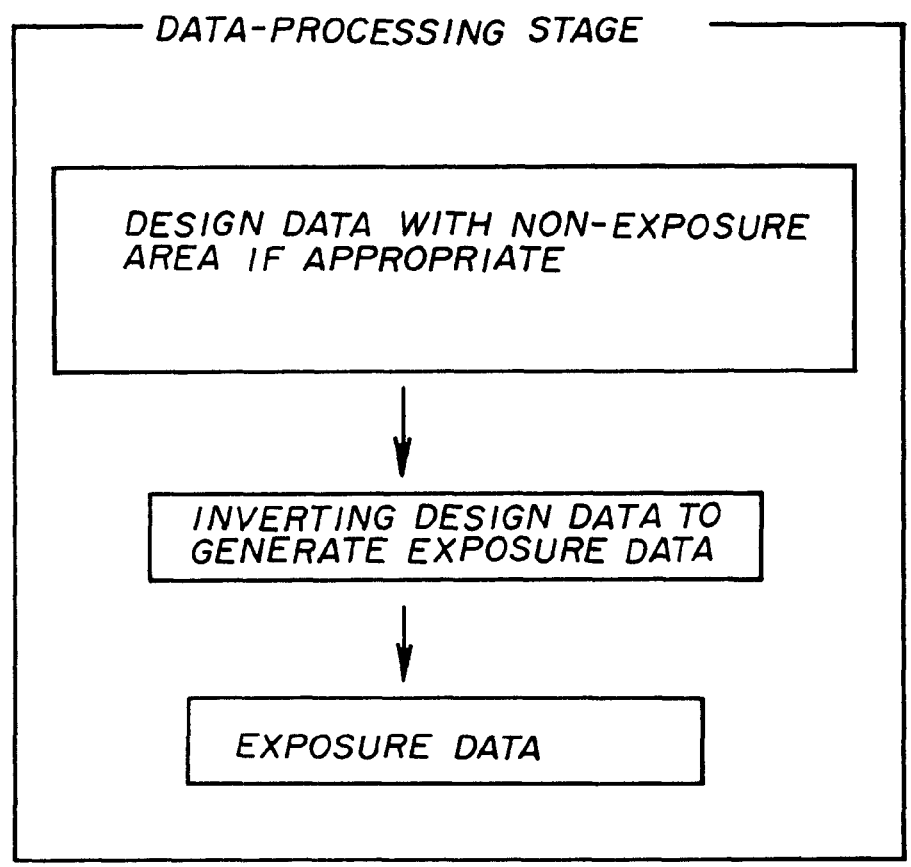
FIG. 16A is a flowchart of a process of generating exposure data based on design data having an non-exposure area therein.

FIG. 16A is a flowchart of a process of generating exposure data based on design data having an non-exposure area therein, and FIG. 16B is an illustrative drawing for explaining generation of the exposure data when the design data has an non-exposure area therein.

FIG. 17 is a flow diagram showing the way the design data of each cell is converted into the exposure data when the design data has an non-exposure area therein.

In FIG. 17, the non-exposure area 39 shown by dotted lines is defined by coordinates of two points indicated by x marks, or may be defined by cell name.

As shown in FIG. 17, the design data is converted into exposure data by the image processing device 62 by switching areas having data therein to areas having no data therein and vice versa. In this inversion process, the non-exposure area, which has no design data therein, is not inverted, and remains as it is.

Through the inversion process, the exposure data MAIN11 through MAIN15 are created as shown at the bottom of FIG. 17. The exposure data MAIN11 as shown in FIG. 16B is an inverse of the design data 36 and the blank area 38 of the cell A with an exception of the non-exposure area 39 where no data inversion is performed. As a result, the exposure data 41 is present only in an area that is shown in black.

The cells a, b, c, and d are comprised of the design data 26, 28, 30, and 32, respectively, which indicate areas which are to be exposed, and are provided with no blank areas. When these cells with no blank areas are converted into the exposure data, the exposure data 41 shown in black is provided in areas surrounding the design data 26, 28, 30, and 32 as shown in the exposure data MAIN12 through MAIN15.

By using the exposure data generated in this manner, a mask pattern is printed as follows.

First, the exposure file of the exposure data MAIN11 is used for printing cell images in a 2-x-2 matrix.

Then, the exposure file of the exposure data MAIN12 is used for printing the cell image a at a designated position.

Further, the exposure files of the exposure data MAIN13 through MAIN15 are used for printing respective cell images at respective positions.

In this manner, a pattern is printed on a reticle. The reticle mask is then used for exposing posi-resist on a semiconductor substrate to exposure light at portions where the exposure data exists as shown by black areas in FIG. 16B. This exposure process generates a photo-resist pattern.

As described above, the exposure-data files are created to reflect a hierarchical structure of the exposure data (design data). Namely, the exposure-data file of the exposure data MAIN11 represents a common data portion shared by a plurality of exposure images, which may be arranged in a 2-x-2 matrix, for example. Portions that differ between these exposure images are represented by individual exposure-data files such as those of the exposure data MAIN12 through MAIN15. Such separation of files reflecting a hierarchical structure of the data is made possible by use of non-exposure areas. Since the common-data portion is extracted and stored as a file in this fashion, there is no need to store the entire exposure data as a single data file in the 2-x-2-matrix form. This reduces the data size of the exposure data by a significant amount compared to the related-art scheme.

In this manner, the present invention represents exposure data in a hierarchical structure, thereby reducing a data size of the exposure data as well as enhancing a design efficiency of a reticle pattern.

In the present invention, the exposure-data file may contain information about a position and a shape of a non-exposure area. Alternatively, the exposure-data file may not include such information, and separate data file in addition to the exposure-data file may be provided in order to specify the position and shape of the non-exposure area that is to be allocated in the exposure data.

Further, the present invention is not limited to these embodiments, but variations and modifications may be made without departing from the scope of the present invention.

The present application is based on Japanese priority application No. 10-240648 filed on Aug. 26, 1998, with the Japanese Patent Office, the entire contents of which are hereby incorporated by reference.

What is claimed:

1. A method of generating exposure data, comprising the steps of:
    a) generating first exposure data representing a common portion shared by different exposure images;
    b) generating second exposure data representing portions which differ between the different exposure images; and
    c) defining at least one non-exposure area with regard to said first exposure data, said at least one non-exposure area corresponding to the portions that differ between the different exposure images and defining an area where no exposure is performed by said first exposure data.

2. The method as claimed in claim 1, further comprising a step of storing said first exposure data and said second exposure data as separate files.

3. The method as claimed in claim 1, further comprising a step of generating design data representing a plurality of cells arranged in the different exposure images, and wherein said step a) includes generating said first exposure data by inverting the design data of at least one of the cells that is commonly used in all the different exposure images, and said step b) includes generating said second exposure data by inverting the design data of each of the remaining cells that are not commonly used in all the different exposure images.

4. The method as claimed in claim 1, wherein said step c) includes defining said at least one non-exposure area by coordinates thereof.

5. The method as claimed in claim 1, wherein said step c) includes defining said at least one non-exposure area by at least one cell.

6. The method as claimed in claim 1, wherein said step c) includes defining said at least one non-exposure area by a single number.

7. The method as claimed in claim 2, further comprising a step of storing information on said at least one non-exposure area in the files of the first and second exposure data.

8. The method as claimed in claim 2, further comprising a step of storing information on said at least one non-exposure area as a separate file in addition to the files of the first and second exposure data.

9. A method of generating exposure data, comprising the steps of:
    a) setting coordinates in a file and allocating exposure data in reference to the coordinates; and
    b) setting a non-exposure area in the file, the non-exposure area defining an area where no exposure data is allocated.

10. The method as claimed in claim 9, wherein said step b) includes a step of setting the non-exposure area in the file by using a single numerical value.

11. A method of forming a pattern on a reticle by using exposure data, comprising the steps of:
    generating first exposure data representing a common portion shared by different exposure images;
    generating second exposure data representing portions which differ between the different exposure images;
    defining at least one non-exposure area with regard to said first exposure data, said at least one non-exposure area corresponding to the portions that differ between the different exposure images and defining an area where no exposure is performed by said first exposure data;
    printing an image of the common portion on the reticle by using said first exposure data with no exposure being performed at said at least one non-exposure area; and printing images of said second exposure data at the portions which differ between the different exposure images.

12. A device for generating exposure data, comprising:

a CPU; and a memory storing a program for controlling said CPU, wherein said CPU operating based on the program stored in said memory carries out steps of:

generating first exposure data representing a common portion shared by different exposure images;

generating second exposure data representing portions which differ between the different exposure images; and defining at least one non-exposure area with regard to said first exposure data, said at least one non-exposure area corresponding to the portions that differ between the different exposure images and defining an area where no exposure is performed by said first exposure data.

13. A device for printing a pattern on a reticle by using exposure data, comprising:

a CPU; and a memory storing a program for controlling said CPU, wherein said CPU operating based on the program stored in said memory carries out steps of:

generating first exposure data representing a common portion shared by different exposure images;

generating second exposure data representing portions which differ between the different exposure images;

defining at least one non-exposure area with regard to said first exposure data, said at least one non-exposure area corresponding to the portions that differ between the different exposure images and defining an area where no exposure is performed by said first exposure data;

printing an image of the common portion on the reticle as many times as there are the different exposure images by using said first exposure data with no exposure being performed at said at least one non-exposure area; and printing images of said second exposure data at the portions which differ between the different exposure images.

* * * * *